(12) United States Patent
Bentzon

(10) Patent No.: US 6,841,988 B1
(45) Date of Patent: Jan. 11, 2005

(54) METHOD FOR THE DETERMINATION OF THE CRITICAL CURRENT FOR A CONDUCTOR INCLUDING SUPERCONDUCTING MATERIAL, AND AN APPARATUS FOR PERFORMING THE METHOD

(75) Inventor: Michael Deleuran Bentzon, Greve (DK)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 09/743,375

(22) PCT Filed: Jul. 15, 1999

(86) PCT No.: PCT/DK99/00404

§ 371 (c)(1),
(2), (4) Date: Feb. 22, 2001

(87) PCT Pub. No.: WO00/04397

PCT Pub. Date: Jan. 27, 2000

(30) Foreign Application Priority Data

| Jul. 16, 1998 | (DK) | ................................ | 1998 000944 |
| Sep. 11, 1998 | (DK) | ................................ | 1998 01148 |

(51) Int. Cl.⁷ .............................................. G01R 31/00
(52) U.S. Cl. ................................... 324/117 H; 324/126
(58) Field of Search ............................. 324/224, 228, 324/117 R–117 H, 126, 127; 505/845, 842, 872

(56) References Cited

U.S. PATENT DOCUMENTS

| 3,731,184 A | * | 5/1973 | Goldberg et al. ........... 324/239 |
| 3,976,934 A | * | 8/1976 | Voigt et al. ................. 324/224 |
| 4,132,949 A | | 1/1979 | Rupp .......................... 324/224 |
| 4,270,088 A | * | 5/1981 | Weischedel ................. 324/241 |
| 5,218,296 A | | 6/1993 | Shinde et al. ............... 324/239 |
| 5,894,223 A | | 4/1999 | Medelius et al. ........... 324/529 |
| 6,320,369 B1 | * | 11/2001 | Hidaka et al. .......... 324/117 R |

FOREIGN PATENT DOCUMENTS

| DE | 2431505 | 4/1775 |
| DE | 2606504 | 8/1977 |
| DE | 19612613 | 10/1997 |
| DE | 19717283 | 4/1998 |
| EP | 0860705 | 8/1998 |

OTHER PUBLICATIONS

Ginsberg, D.M., ed., *Physical Properties of High Temperature Superconductors I*, Singapore (and N.J.), World Scientific Publishing Col Ptc. Ltd., 1989, pp 84–109.

Cololough, M.S., et al. "Pulsed Critical Current Measurements on YBCO Wires and Screen–Printed Films.." Cryogenics vol. 30, (1990) pp 439–444.

* cited by examiner

Primary Examiner—Vinh P. Nguyen
(74) Attorney, Agent, or Firm—Ladas & Parry

(57) ABSTRACT

A method and apparatus for determining a critical current of a conductor at least including superconducting material conveys the conductor in a superconducting state through a varying external magnetic field. A part of at least a first contact-free measurement of a magnetic field that results from influence of the external magnetic field on the conductor that is out of phase with the external magnetic field is determined for determining the critical current of the conductor.

20 Claims, 4 Drawing Sheets

Figure 1:
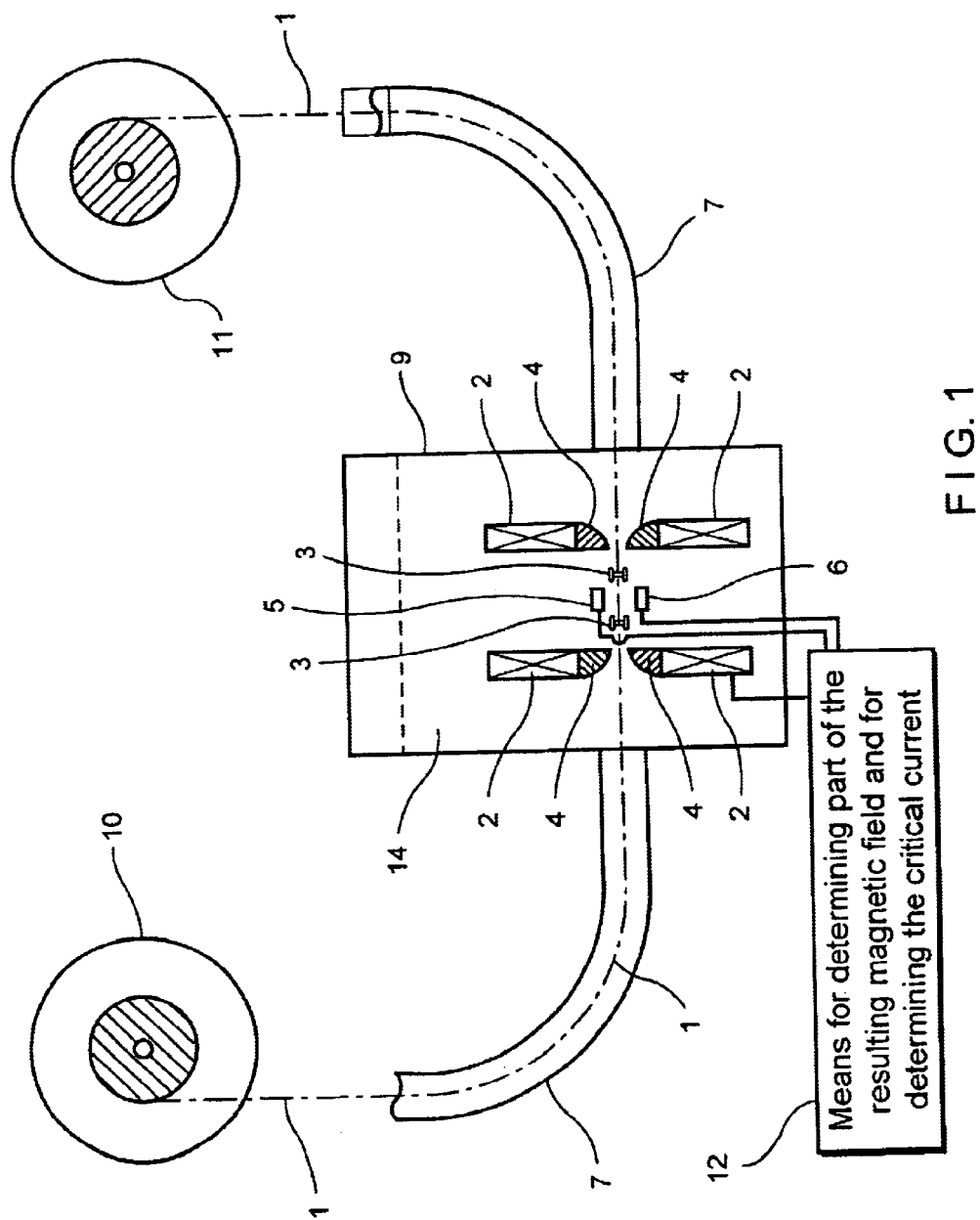

METHOD FOR THE DETERMINATION OF THE CRITICAL CURRENT FOR A CONDUCTOR INCLUDING SUPERCONDUCTING MATERIAL, AND AN APPARATUS FOR PERFORMING THE METHOD

The invention relates to the determination of the critical current for a conductor including superconducting material, and to an apparatus for performing the method.

Conductors comprising superconducting material have different uses, e.g. in connection with magnets, transformers, and as conductors for electrical power distribution. Superconducting material is advantageously used in conductors as the superconducting material can be brought into a superconducting state enabling electrical energy to be transmitted with little energy loss. Reduced electrical power loss is also advantageous as it enables construction of e.g. transformers, magnets, and conductors with smaller dimensions compared to the use of conventional conductors.

Conductors comprising superconducting material can be constructed as a single core conductor, but is often constructed as a number of filaments arranged to form a multi-core conductor.

When a superconductor is brought into the superconduction state, e.g. by cooling, electrical power can be transmitted with little loss, as long as the current is lower than the so-called critical current. The critical current, i.e. that current which the superconductor material is able to support without going into a normally conductive state, is a characteristic value of the given superconductor. It is of great importance to determine the critical current for a conductor comprising superconducting material, as the value of the critical current is needed when dimensioning e.g. a transformer including superconductors.

As the value of the critical current may vary along the conductor, it is of interest to determine the critical current along the superconductor in order to characterize the superconductor. It is of interest to perform the characterization of the conductor as a contact-less measurement as it enables a continuous determination of the critical current for a conductor over the entire length of the conductor. In addition, the contact-less measurement has the advantage of saving the conductor and the measurement means from wear due to mechanical contact.

A method and an apparatus for testing a conductor which consists at least partially of superconductive material is disclosed in U.S. Pat. No. 3,976,934. The patent teaches that the testing of a conductor with superconductive material in the superconducting state can be performed by moving the conductor through an external magnetic field which induces shielding currents in the superconductor material and by measuring the magnetic field generated by these shielding currents. The critical current is determined using the measured shielding field.

The object of the invention is to provide a method for the determination of the critical current for a conductor including superconducting material, which method gives a better and more reliable determination than methods according to the prior art.

This object is achieved by performing the method as stated in the characterizing portion of claim 1.

According to the invention, the determination of the critical current for a conductor including superconducting material is performed using a method, wherein said conductor is brought into a superconducting state, and wherein a varying external magnetic field is generated, through which said conductor is conveyed, and wherein a first measurement means is used to carry out a first contact-free measurement of the resulting magnetic field that occurs as a consequence of the influence of the conductor by said external magnetic field. The part of the resulting magnetic field out of phase with the external magnetic field is determined, and the critical current of the conductor is determined on the basis thereof.

The method according to the invention is advantageous as it uses a so-called coupling of the filaments in a conductor having a multi-filament structure to obtain a larger signal to noise ratio for the measured signal due to the fact that the measurement is performed on all the filaments in the conductor. The resulting magnetic field is larger when the filaments are coupled, as each filament hereby contributes constructively to the generation of the resulting magnetic field.

The method according to the invention is advantageous over prior art methods in which the resulting magnetic field, which reflects the value of the critical value, is relatively small due to field suppression. Due to field suppression, that the superconducting characteristics of a superconductor are reduced when exposed to a external magnetic field. Field suppression results in a relatively. small magnetic field which reflect the critical current which provides a relatively small signal to noise ratio in the measured signal.

Using a method according to the prior art, it is difficult to obtain an optimum magnetic field in practice as both a too small and a too large external magnetic field result in a magnetic field which is lower than the optimum magnetic field. An optimum external field, when using a method according to the prior art, is a field that is large enough to induce shielding currents in the entire cross-section of the superconductor material to reach the critical current density. As the value of an optimum external value typically varies along the conductor, the measured magnetic field will therefore reflect this unwanted effect. These difficulties are avoided when using a method according to the invention as that part of the resulting magnetic field which is out of phase with the external magnetic field is used to determine the critical current.

In a preferred embodiment, a second measurement is carried out on the resulting magnetic field from another side in relation to the conductor by using a second measurement means. This second measurement is performed in addition to said first measurement of the resulting magnetic field from a first side in relation to the conductor. On the basis of these measurements, a more reliable result can be obtained. It also permits a supervision of the measurement. For example, it is possible to determine the distance between the conductor and the measurement means, and hereby to supervise the conveyance of the conductor, and it is possible to observe differences between the measurements of the different measurement means, which can e.g. be caused by ice on the measurement means.

In a preferred embodiment, compensation is made for measurement variations that occur as a consequence of variations in distance between conductor and measurement means. This compensation is made on the basis of said first measurement, or any value derived therefrom, and on the basis of said second measurement, or any value derived therefrom.

It is particularly advantageous to perform said compensation by means of the formula $U=((A+B)-k(A-B)^2)/2$, wherein a corrected field value U is determined on the basis of the value A that is the field value from said first measurement or a value derived therefrom, and on the basis of the value B that is the field value of said second measurement or a value derived therefrom.

The invention also relates to an apparatus for the determination of the critical current for a conductor including a superconducting material adapted to perform the method according to the invention.

The apparatus comprises a conveyor arranged to convey the conductor through the apparatus, a cryostat arranged to cool the conductor to make it assume a superconducting state, a field generation device arranged to generate a varying magnetic field through which the conductor is conveyed, and a first measurement means arranged to carry out a measurement of the resulting magnetic field that occurs as a consequence of the influence of said magnetic field on said conductor. The apparatus further comprises means arranged to determine, on the basis of the measured magnetic field, that part which is out of phase with the resulting magnetic field, and on the basis of this to determine the critical current of the conductor.

In a preferred embodiment of the invention the field generating device comprises Helmholtz coils.

In a preferred embodiment, said first measurement means in the apparatus is arranged to carry out a measurement of the resulting magnetic field from a first side in relation to the conductor, and the apparatus further comprises a second measurement means arranged to carry out a measurement of the resulting magnetic field from another side in relation to the conductor. This is advantageous as the apparatus can be used to perform a more reliable measurement, and to supervise the measurement. Hereby it is possible to determine the distance between the conductor and the measurement means, and to supervise the conveyance of the conductor. By observing the measurements from the different measurement means, it is also possible to determine the differences, which e.g. can be caused by ice on the measurement means.

The apparatus advantageously comprises compensating means arranged to compensate, on the basis of measurements from said first and said second measurement means or values derived therefrom, for measurement variations due to the distance between conductor and measurement means.

Said compensating means is advantageously arranged to carry out said compensation by using the formula $U=((A+B)-k(A-B)^2)/2$, wherein a corrected field value U is determined on the basis of said measured field value A from said first measurement means or any value derived therefrom, and on the basis of the measured field value B from said second measurement means or any value derived therefrom.

In a preferred embodiment, said cryostat comprises a mechanical control device for controlling the conveyance of the conductor through the cryostat, and said cryostat is arranged to contain a coolant for cooling the conductor.

In a preferred embodiment, the apparatus comprises two separate guides between which the conductor is freely suspended, and said field generating device and measurement device are arranged between the two guides. This is advantageous as the cryostat does not include any movable parts. It is further advantageous as the cryostat does not include components which could influence the measurements.

Said control device advantageously comprises two slide guides, which is advantageous due to the simple and hereby sturdy construction.

In a preferred embodiment of the apparatus said guides are made of high density polyethylene. This is advantageous as this material can withstand the influence from the environment.

Figure 2:
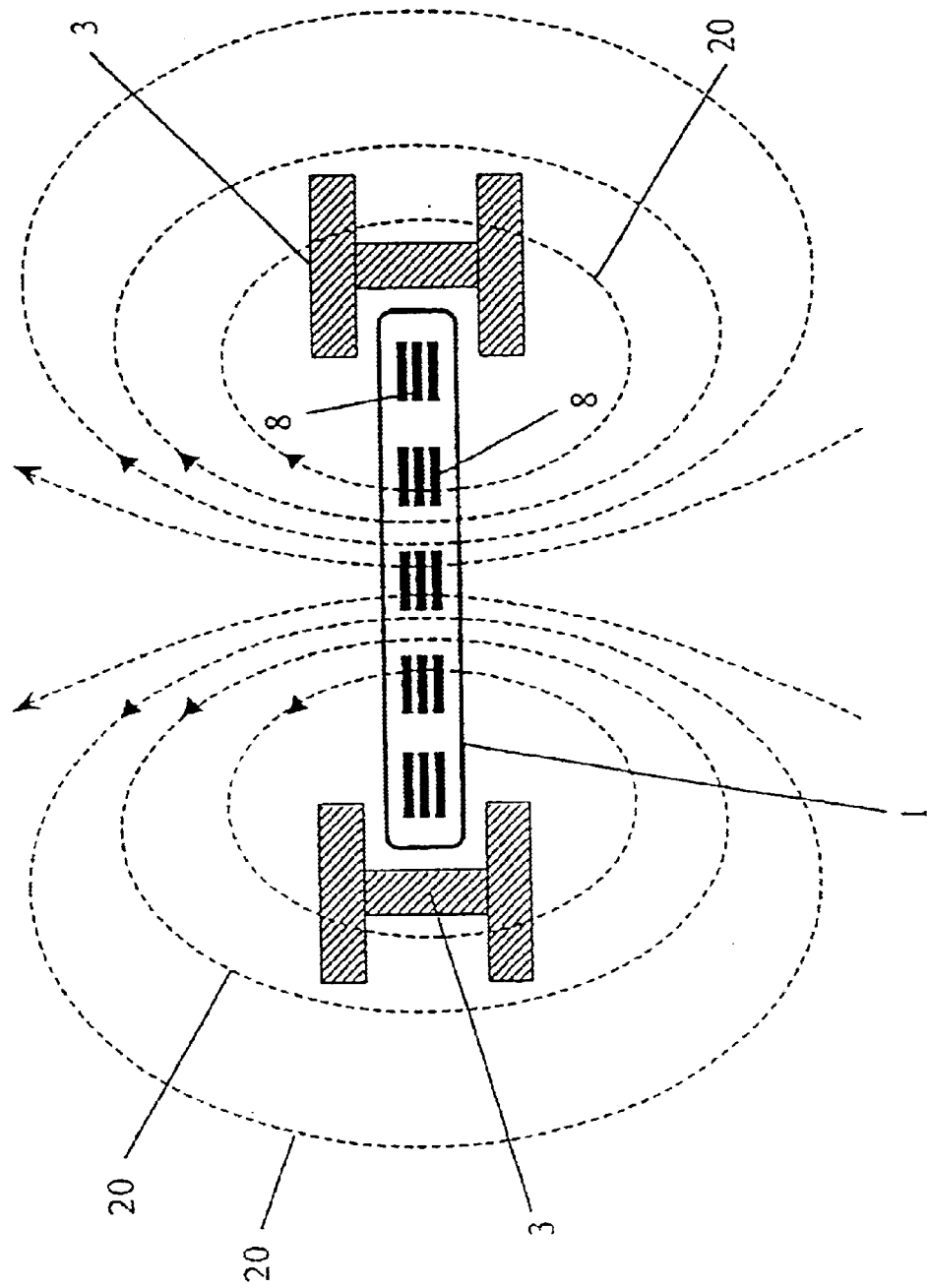
Figure 3:
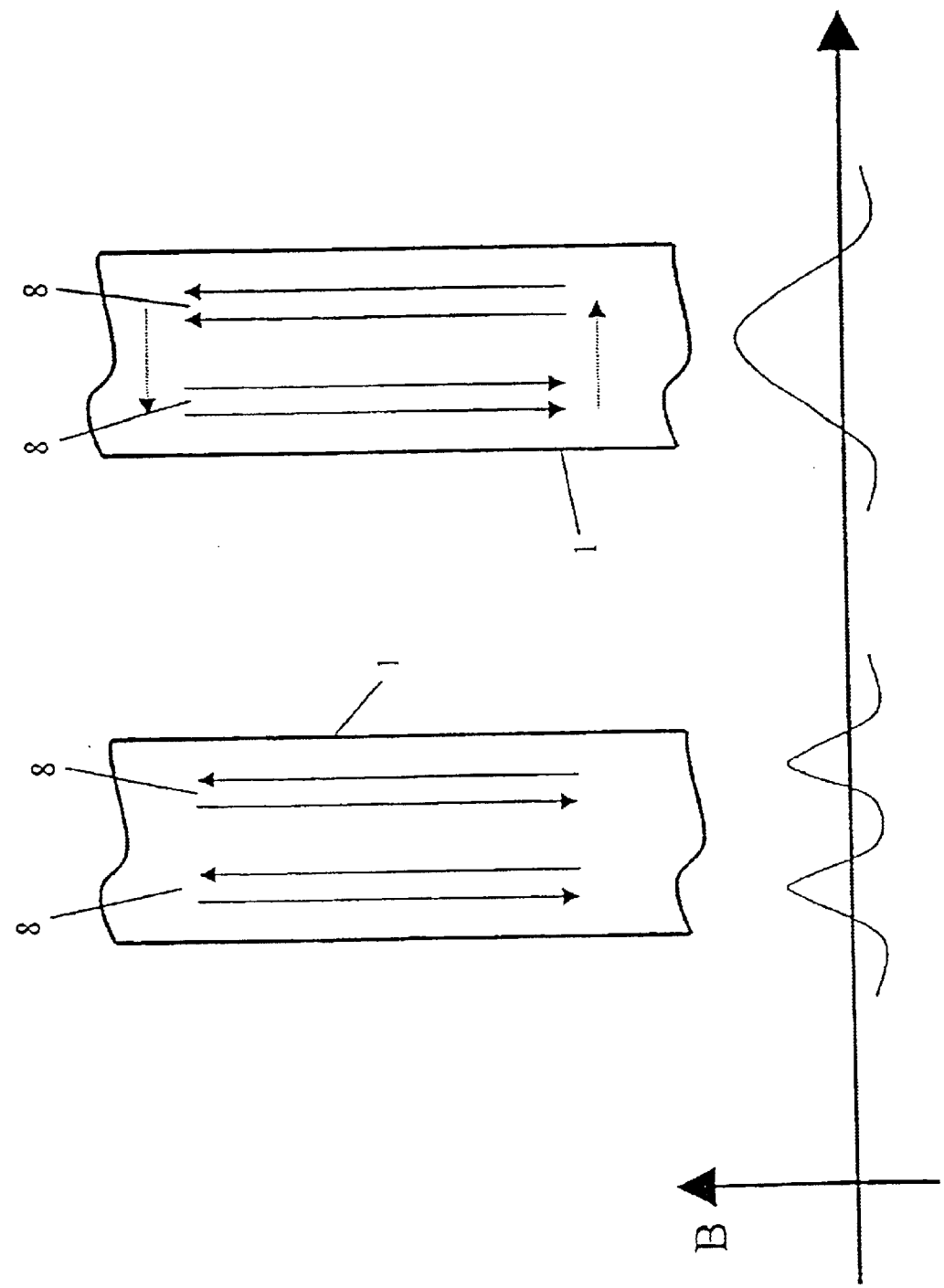
Figure 4:
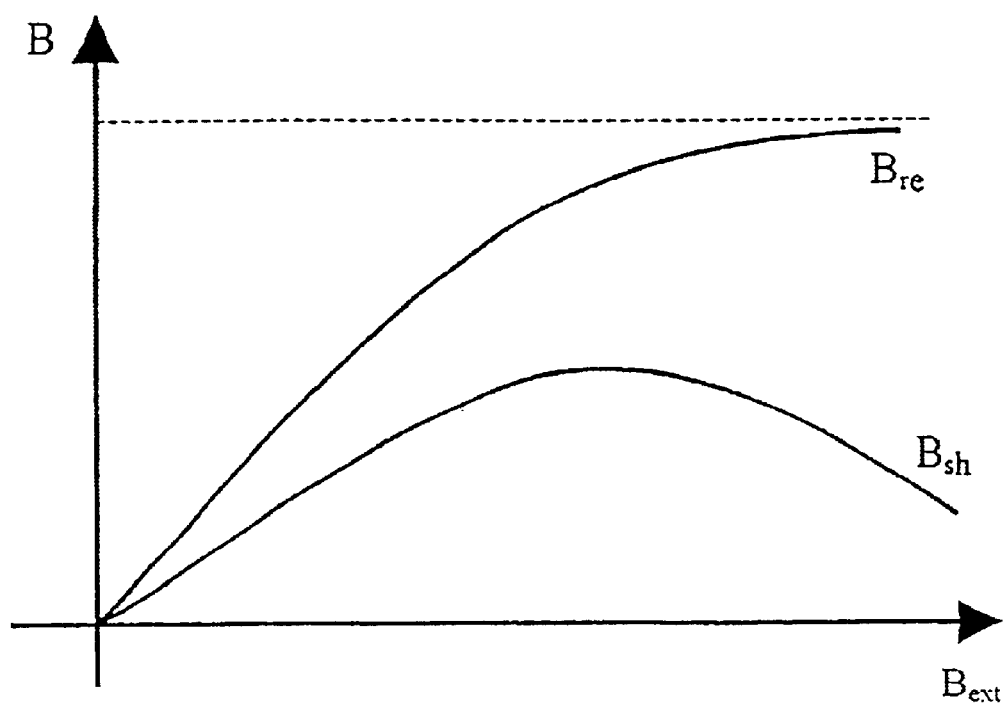

The invention will be explained more fully by the following description with reference to the drawing, in which FIG. 1 is a side view of an apparatus according to the present invention, FIG. 2 shows a section of the apparatus according to the invention from a second side, FIG. 3 illustrates the coupling of filaments in a conductor including superconducting material, and FIG. 4 illustrates the relationship between the shielding field and the external magnetic field, and the relationship between the remanent field and the external magnetic field.

FIG. 1 shows a preferred embodiment of an apparatus according to the invention. The cryostat containing the cooling medium 14 consists of a central vessel 9 and two tubes 7. A conductor 1 including superconducting material is conveyed from a coil 10 into the cryostat 7,9 through a field generating device 2, out of the cryostat and recoiled 11. The apparatus also comprises a mechanical control device which is designed to assure that the conductor movement in vertical and horizontal directions is restricted and that the conductor is not exposed to bending radius smaller than a given value, e.g. 200 mm. The field generating device 2, for generating the external magnetic field is also called the magnet 2 hereinafter, may be constructed as a pair of Helmholtz coils. In the magnet 2 the filed, B, is normal to the conductor surface and the field strength is advantageously high enough to obtain twice the field of full penetration for the actual superconductor. A first measurement means 6 for measuring the resulting magnetic field are placed above and below the tape (i.e. conductor) respectively. The measurement means 5,6 which are also called magnetic sensors 5,6 hereinafter, may e.g. be Hall probes, inductance coils, or superconducting circuits (squids).

The mechanical control device comprises two slide guides 3,4, which is advantageous due to the simple and hereby sturdy construction. The conductor is freely suspended between the two slide guides which are separated. The field generating device and the measurement device are arranged between the two guides. This is advantageous as the cryostat does not include any movable parts. It is further advantageous as the cryostat does not include components which could influence the performed measurements. The guides are made of high density polyethylene, but can be made of other material if desired.

When the conductor 1 is conveyed through the apparatus, by using a conveyor (not shown), the conductor is conveyed through the cooling medium 14 and is hereby brought into a superconducting state. The magnet 2 is adapted to generate a varying external magnetic field through which said conductor is conveyed. Hereby a magnetic field is generated. A first contact-free measurement of the resulting magnetic field that occurs as a consequence of the influence of said external magnetic field on the conductor is carried out using the first measurement means 5. The resulting magnetic field is also measured from another side in relation to the conductor using the second measurement means 6. It is advantageous to perform both the first and the second measurement, as they result in a more reliable measurement and make it possible to supervise the measurement, e.g. to determine the distance between the conductor and the measurement means, and hereby to supervise the conveyance of the conductor. It is also advantageous as it permits observation of differences between the measurements of the different measurement means 5,6, which can e.g. be caused by ice or the measurement means 5,6, or be caused by defects.

The resulting magnetic field is a sum of the external field and the field induced by the superconductor, i.e. the so-called self-field. The self-field contains information about the superconducting properties of the tape. These properties are the critical current, the critical current distribution and density, distribution of induced superconducting and non-superconducting currents, coupling of filaments, filament geometry, induced AC losses, field suppression, etc. All of these properties will influence the amplitude and time dependence of the self-field. It is noted that the frequency of the varying external magnetic field is given a certain high value in order to ensure coupling of all the filaments in the conductor 1.

On the basis of the measurement means 12 for determining part of the resulting magnetic field and for determining the critical current determines which part of the resulting magnetic field is out of phase with the external magnetic field. The critical current is determined by means 12 on the basis thereof. It is note that the part of the measured magnetic field which is in phase and out of phase with the external field will be close to the shielding field and the remanent field respectively and are taken as the most important parameters describing the superconducting properties of the conductor 1.

On basis of the first measurement, or any value derived therefrom, and on the basis of said second measurement, or any value derived therefrom, a compensation is made for measurement variations that occur as a consequence of variations in distance between conductor 1 and measurement means 5,6. The compensation is e.g. performed by means of the formula $U=((A+B)-k(A-B)^2)/2$, wherein a corrected field value U is determined on the basis of the value A that is the field value from said first measurement or a value derived therefrom, and on the basis of the value B that is the field value of said second measurement or a value derived therefrom. It is noted, that k is a constant having a given value, e.g. 0.42.

The method according to the invention is advantageous as the coupling of the filaments in a conductor having a multi-filament structure provides a larger signal to noise ratio for the measured signal due to the fact that the measurement is performed on all the filaments in the conductor simultaneously. The resulting magnetic field is larger when the filaments are coupled, which will be described in the following.

FIG. 2 shows a section of the apparatus of FIG. 1 from a second side. The conveyer means 3 are designed to keep the tape steady in horizontal as well as vertical directions.

The conductor 1, which comprises superconducting material, is formed as a tape and includes a number of filaments 8 arranged to form a multi-core conductor. The conductor 1 is also called the tape 1 hereinafter, even though the conductor can also be formed in other ways.

Each filament 8 comprises superconducting material and is typically enclosed by another material e.g. silver, in order to give a flexible structure. Different types of superconducting materials are used, and can e.g. comprise Bismuth (Bi), Strontium (Sr), Calcium (Ca) and Copper (Cu) in a given ratio.

The filaments 8 in the tape 1 may be coupled due to the time derivative of the external magnetic field. The effect of coupling is that the filaments appear as one superconductor, and this is illustrated by the field lines 20 representing the lines from a single superconductor.

FIG. 3 illustrates the importance of filament coupling. The figure shows the field above two tapes where the filaments are not coupled (left) and where the filaments are coupled (right). Coupling of filaments increases with the time derivative of the field and with the conductivity of the matrix material. Coupling of the filaments makes the superconducting currents couple together into one loop carrying the critical current. The magnetic field obtained by such a loop is much stronger than the field obtained by several loops. This is illustrated in the figure by only two filaments. The effect increases with the number of filaments. When the filaments couple, the magnetic field is much bigger and more easy to measure and the relation between the measured field and the critical current is simple the calculate by using Biot-Savart's law.

FIG. 4 illustrates the relationship between the shielding field and the external magnetic field, and the relationship between the remanent field and the external magnetic field. The critical current carried by the superconductor depends on the amplitude of the external field. This is due to the field suppression. The remanent field will in crease with the external field until saturation occurs around twice the field of full penetration. Then the remanent field is saturated. The shielding field will start decreasing at higher fields due to the field suppression. The remanent field is advantageously measured when the external field is zero, while the shielding field is at its maximum value. The remanent field will be a measure of the critical current at zero external field (self field).

It is further noted that the method also may be applied as follows:

1) The shielding field (the field set up by the SC being in phase with the external field) may be used to determine the critical current at the actual external field amplitude for fields exceeding the field of full penetration.

2) A very reliable determination of the critical current in self field conditions is obtained by comparing the remanent field obtained at high external fields (at least twice the field of full penetration) to the shielding field obtained at low external field (e.g. 10% of the field off full penetration.

In the ratio $B_{remanent}$ (high field)/$B_{shielding}$ (low field) the influence of geometrical variations (e.g. in the width or thickness of the SC) is cancelled out, and the ratio is therefore a more reliable image of the critical current at self field conditions.

Although a preferred embodiment of the present invention has been described and shown, the invention is not limited to it, but may also be embodied in other ways within the scope of the subject-matter defined in the appended claims.

What is claimed is:

1. A method of determining the critical current of a conductor including superconducting material, the method comprising bringing said conductor into a superconducting state, conveying said conductor through a varying external magnetic field, carrying out, by means of a first measurement means, a first contact-free measurement of a resulting magnetic field, the resulting magnetic field occurring as a consequence of the influence of said external magnetic field on the conductor, determining a part of the resulting magnetic field that is out of phase with the external magnetic field, and determining the critical current of the conductor from the determined part of the resulting magnetic field out of phase with the external magnetic field.

2. A method according to claim 1, wherein the step of carrying out the first contact-free measurement of the resulting magnetic field comprises carrying out the first contact-free measurement from a first side in relation to the conductor; and wherein the method further comprises carrying out a second measurement of the resulting magnetic field from a second side, opposite to the first side, in relation to the conductor using a second measurement means; and the method further comprises determining, from said first measurement, or any value derived therefrom, and from said second measurement, or any value derived therefrom, a corrected field value of the resulting magnetic field, the corrected field value being compensated for measurement variations that occur as a consequence of variations in distance between conductor and measurement means.

3. A method according to claim 2, wherein the step of determining a corrected field value comprises determining a corrected field value U by means of the formula $U=((A+B)-k(A-B)^2)/2$, wherein the value A is the field value from said first measurement or a value derived therefrom, and wherein the value B is the field value of said second measurement or a value derived therefrom.

4. An apparatus for determining the critical current of a conductor including a superconducting material, the apparatus comprising
   a conveyor arranged to convey the conductor through the apparatus,
   a cryostat arranged to cool the conductor and to make it reach a superconducting state,
   a field generation device arranged to generate a varying external magnetic field through which the conductor is conveyed, and
   a first measurement means arranged to carry out a measurement of the resulting magnetic field that occurs as a consequence of the influence of said external magnetic field on said conductor;
   wherein the apparatus is arranged to determine a part of the resulting magnetic field that is out of phase with the external magnetic field, and to determine the critical current of the conductor on the basis of the determined part of the resulting magnetic field out of phase with the external magnetic field.

5. An apparatus according to claim 4, wherein the field generating device comprises Helmholtz coils.

6. An apparatus according to claim 4, wherein said first measurement means is arranged to carry out a measurement of the resulting magnetic field from a first side in relation to the conductor; wherein the apparatus further comprises a second measurement means arranged to carry out a measurement of the resulting magnetic field from a second side, opposite to the first side, in relation to the conductor; and wherein the apparatus is further arranged to determine, on the basis of measurements from said first and said second measurement means or values derived therefrom, a connected field value of the resulting magnetic field, the corrected field value being compensated for measurement variations due to the distance between conductor and measurement means.

7. An apparatus according to claim 6, further arranged to determine a corrected field value U using the formula $U=((A+B)-k(A-B)^2)/2$, on the basis of said measured field value A from said first measurement means or any value derived therefrom, and on the basis of the measured field value B from said second measurement means or any value derived therefrom.

8. An apparatus according to claim 4, wherein said cryostat comprises a mechanical control device for controlling the conveyance of the conductor through the cryostat, and that said cryostat is arranged to contain a coolant for cooling the conductor.

9. An apparatus according to claim 8, wherein said control device comprises two separate guides between which the conductor is freely suspended, and that said field generating device and measurement device are arranged between the two guides.

10. An apparatus according to claim 8, wherein said control device comprises two slide guides.

11. An apparatus according to claim 10, wherein said guides are made of high density polyethylene.

12. A method of determining a critical current of a conductor at least including superconducting material, the method comprising:
    bringing a conductor at least including a superconducting material into a superconducting state;
    relatively conveying the conductor through a varying external magnetic field;
    carrying out with first measurement means a first contact-free measurement of a magnetic field resulting as a consequence of the influence of the external magnetic field on the conductor;
    determining a part of the first contact-free measurement of the resulting magnetic field that is out of phase with the external magnetic field; and
    determining a critical current of the conductor from the determined part of the resulting magnetic field out of phase with the external magnetic field.

13. A method of determining a critical current of a conductor at least including superconducting material, the method comprising:
    bringing a conductor at least including a superconducting material into a superconducting state;
    relatively conveying the conductor through a varying external magnetic field;
    carrying out with first measurement means a first contact-free measurement of a magnetic field resulting as a consequence of the influence of the external magnetic field on the conductor, wherein carrying out the first contact-free measurement of the resulting magnetic field comprises carrying out the same from a first side of the conductor;
    carrying out a second contact-free measurement of the resulting magnetic field from a second, opposite side of the conductor, and
    determining from the first contact-free measurement or a value derived therefrom and from the second contact-free measurement or a value derived therefrom a corrected field value of the resulting magnetic field, the corrected field value being compensated for measurement variations that occur as a consequence of variations in distance between the conductor and measurement means;
    determining a part of the corrected field value that is out of phase with the external magnetic field; and
    determining a critical current of the conductor from the determined part of the corrected field value.

14. A method according to claim 13, wherein the determining of the corrected field value comprises determining the corrected field value U by means of the formula $U=((A+B)-k(A-B)^2)/2$, wherein A is the first contact-free measurement or a value derived therefrom, and B is the second contact-free measurement or a value derived therefrom.

15. An apparatus for determining the critical current of a conductor including a superconducting material, the apparatus comprising:

a field generation device for generating a varying magnetic field;

a conveyor for conveying a conductor through the varying magnetic field;

a cryostat for cooling as conveyed through the the conductor in a superconducting state;

a first measurement means for measuring a magnetic field resulting as a consequence of influence of the varying magnetic field on the conductor;

means for determining a part of the resulting magnetic field that is out of phase with the varying magnetic field; and means for determining a critical current of the conductor on the basis of the determined part of the resulting magnetic field out of phase with the external magnetic field.

16. An apparatus according to claim 15, wherein the field generation device comprises Helmholtz coils.

17. An apparatus according to claim 15, wherein the cryostat comprises a mechanical control device for controlling the conveying of the conductor through the cryostat, and the cryostat is arranged to contain a coolant for cooling the conductor.

18. An apparatus according to claim 17, wherein the control device comprises two separate guides between which the conductor is freely suspended, and the field generating device and measurement device are between the two guides.

19. An apparatus according to claim 17, wherein at least one of the guides comprises a slide guide.

20. An apparatus according to claim 19, wherein the slide guide comprises high density polyethylene.

\* \* \* \* \*